(12) United States Patent
Pu et al.

(10) Patent No.: US 11,685,986 B2
(45) Date of Patent: Jun. 27, 2023

(54) TANTALUM-DOPED MOLYBDENUM DISULFIDE/TUNGSTEN DISULFIDE MULTI-LAYER FILM AS WELL AS PREPARATION METHOD AND USE THEREOF

(71) Applicant: NINGBO INSTITUTE OF MATERIALS TECHNOLOGY & ENGINEERING, CHINESE ACADEMY OF SCIENCES, Ningbo (CN)

(72) Inventors: Jibin Pu, Ningbo (CN); Liping Wang, Ningbo (CN); Haixin Wang, Ningbo (CN); Chun Zeng, Ningbo (CN); Qunji Xue, Ningbo (CN)

(73) Assignee: NINGBO INSTITUTE OF MATERIALS TECHNOLOGY & ENGINEERING, CHINESE ACADEMY OF SCIENCES, Ningbo (CN)

( * ) Notice: Subject to any disclaimer, the term of this patent is extended or adjusted under 35 U.S.C. 154(b) by 0 days.

(21) Appl. No.: 17/640,840

(22) PCT Filed: Oct. 26, 2020

(86) PCT No.: PCT/CN2020/123640
§ 371 (c)(1),
(2) Date: Mar. 7, 2022

(87) PCT Pub. No.: WO2021/143256
PCT Pub. Date: Jul. 22, 2021

(65) Prior Publication Data
US 2022/0341023 A1    Oct. 27, 2022

(30) Foreign Application Priority Data

Jan. 19, 2020 (CN) .......................... 202010057982.3
Jul. 23, 2020 (CN) .......................... 202010716602.2

(51) Int. Cl.
C23C 14/06 (2006.01)
C23C 14/35 (2006.01)
(Continued)

(52) U.S. Cl.
CPC ........ *C23C 14/0623* (2013.01); *C23C 14/165* (2013.01); *C23C 14/345* (2013.01); *C23C 14/3492* (2013.01); *C23C 14/352* (2013.01)

(58) Field of Classification Search
CPC . C23C 14/0623; C23C 14/165; C23C 14/345; C23C 14/3492; C23C 14/352
See application file for complete search history.

(56) References Cited

FOREIGN PATENT DOCUMENTS

| CN | 1757788 A | 4/2006 |
|---|---|---|
| CN | 101398123 A | 4/2009 |

(Continued)

OTHER PUBLICATIONS

Stefan Cwik, et al., Direct Growth of MoS2 and WS2 Layers by Metal Organic Chemical Vapor Deposition, Advanced Materials Interfaces, 2018, pp. 1800140 (1-11), 5.

(Continued)

*Primary Examiner* — Laura A Auer
(74) *Attorney, Agent, or Firm* — Bayramoglu Law Offices LLC (57) ABSTRACT

The tantalum-doped molybdenum disulfide/tungsten disulfide ($MoS_2/WS_2$) multi-layer film includes a titanium transition layer, a titanium/tantalum/molybdenum disulfide/tungsten disulfide ($Ti/Ta/MoS_2/WS_2$) multi-layer gradient transition layer, and a tantalum-doped $MoS_2/WS_2$ multi-layer layer which are successively laminated in a thickness direction. The preparation method includes: successively depositing the titanium transition layer, the $Ti/Ta/MoS_2/WS_2$ multi-layer gradient transition layer, and the tantalum-doped $MoS_2/WS_2$ multi-layer layer on the surface of a matrix by (Continued)

adopting a magnetron sputtering technology to obtain the tantalum-doped $MoS_2/WS_2$ multi-layer film. The tantalum-doped $MoS_2/WS_2$ multi-layer film has good matrix binding strength, hardness and elasticity modulus, good friction and abrasion performance, good temperature self-adopting performance, heat and humidity resistance, and high temperature oxidization resistance under an atmospheric environment at different temperatures, and can meet the requirements of stable lubrication and long-life service of aerospace vehicles.

16 Claims, 6 Drawing Sheets

(51) Int. Cl.
    *C23C 14/16*     (2006.01)
    *C23C 14/34*     (2006.01)

(56) References Cited

FOREIGN PATENT DOCUMENTS

| | | |
|---|---|---|
| CN | 102453854 A | 5/2012 |
| CN | 104805404 A | 7/2015 |
| CN | 104962859 A | 10/2015 |
| CN | 104992983 A | 10/2015 |
| CN | 106521441 A | 3/2017 |
| CN | 110195207 A | 9/2019 |
| CN | 110205609 A | 9/2019 |
| CN | 110578115 A | 12/2019 |
| CN | 111172498 A | 5/2020 |
| CN | 111621745 A | 9/2020 |
| EP | 0842306 B1 | 1/2000 |
| EP | 1712654 B1 | 12/2009 |
| JP | 2007063452 A | 3/2007 |

OTHER PUBLICATIONS

Shi Kaifeng, et al., Preparation Methods of Nano WS2 and MoS2 Thin Films, Chemical Industry Times, 2017, pp. 32-35, vol. 31 No. 1.

Chun Zeng, et al., Study on atmospheric tribology performance of MoS2-W films with selfadaption to temperature, Ceramics International, 2019, pp. 15834-15842, 45.

TANTALUM-DOPED MOLYBDENUM DISULFIDE/TUNGSTEN DISULFIDE MULTI-LAYER FILM AS WELL AS PREPARATION METHOD AND USE THEREOF

CROSS REFERENCE TO RELATED APPLICATIONS

The present application is the national phase entry of International Application No. PCT/CN2020/123640, filed on Oct. 26, 2020, which is based upon and claims priority to Chinese Patent Application No. 202010057982.3, filed on Jan. 19, 2020, and Chinese Patent Application No. 202010716602.2, filed on Jul. 23, 2020, the entire contents of which are incorporated herein by reference.

TECHNICAL FIELD

The present application relates to a tantalum-doped molybdenum disulfide/tungsten disulfide multi-layer film, particularly to a tantalum-doped molybdenum disulfide/tungsten disulfide multi-layer film and a preparation method thereof for a surface of a matrix that is serviced with alternating temperatures under an atmospheric environment, which belong to the technical field of surface treatment.

BACKGROUND

Spacecrafts and satellites need to undergo harsh and complicated environment conditions such as high humidity and alternation of high and low temperatures in the process of launching, and therefore there is a need to develop a solid lubricant coating that has a stable lubricating property within a wide temperature and humidity range. $MoS_2$ and $WS_2$ are typical stratified structural materials, and a force between their molecular layers is a weak Van der Waals bonding force. A shearing stress force required for sliding along a (002) crystal face is relatively low, exhibiting a good solid lubricating property. However, since $MoS_2$ has poor moisture resistance, its operating temperature is less than 350° C.; although the operating temperature of $WS_2$ is higher than 350° C., its lubricating property at a low temperature is poorer than that of $MoS_2$.

To further improve the humidity resistance and high temperature resistance of molybdenum disulfide/tungsten disulfide, many researchers have done a lot of researches on co-sputtering $MoS_2$ and $WS_2$ films. Even so, they do not meet atmospheric environment oxidation resistance, low humidity sensitivity, high temperature oxidation resistance and mechanical performance requirements of aerospace solid lubricating films. Therefore, it is necessary to prepare a multi-layer film to improve the property of a single structure film in combination with $MoS_2$ and $WS_2$ having different property advantages under special environments. Although a multi-layer interface facilitates the improvement of corrosion resistance of such the materials, pure $MoS_2$ and $WS_2$ are still easily oxidized at high temperature and high humidity, hence it is extremely important to further improve the oxidation resistance, humidity sensitive property, high temperature oxidization property and mechanical properties such as hardness of the $MoS_2$ and $WS_2$ based solid lubricating film under the atmospheric environment.

SUMMARY

The main objective of the present application is to provide a tantalum-doped molybdenum disulfide/tungsten disulfide multi-layer film and a preparation method thereof, in order to overcome the defects in the prior art.

Another objective of the present application is to provide use of the tantalum-doped molybdenum disulfide/tungsten disulfide multi-layer film.

In order to realize the above objectives, the present application adopts the following technical solution:

The embodiment of the present application provides a tantalum-doped molybdenum disulfide/tungsten disulfide multi-layer film, comprising a titanium transition layer, a titanium/tantalum/molybdenum disulfide/tungsten disulfide multi-layer gradient transition layer and a tantalum-doped molybdenum disulfide/tungsten disulfide multi-layer layer which are successively laminated in the thickness direction of the tantalum-doped molybdenum disulfide/tungsten disulfide multi-layer film.

The embodiment of the present application also provides a preparation method of the above tantalum-doped molybdenum disulfide/tungsten disulfide multi-layer film, comprising: successively depositing the titanium transition layer, the titanium/tantalum/molybdenum disulfide/tungsten disulfide multi-layer gradient transition layer and the tantalum-doped molybdenum disulfide/tungsten disulfide multi-layer layer on a surface of a matrix by adopting a magnetron sputtering technology to obtain the tantalum-doped molybdenum disulfide/tungsten disulfide multi-layer film.

In some preferred embodiments, the preparation method comprises: by adopting the magnetron sputtering technology, using a titanium target as a negative electrode target and using an inert gas as a work gas, applying a target current to the titanium target, and applying a negative bias to the matrix, thereby depositing the titanium transition layer on the surface of the matrix.

In some preferred embodiments, the preparation method comprises: by adopting the magnetron sputtering technology, using the titanium target, a molybdenum disulfide target, a tungsten disulfide target and a tantalum target as negative electrode targets and using the inert gas as the work gas, applying a target current to the titanium target, the molybdenum disulfide target, the tungsten disulfide target and the tantalum target, and applying a negative bias to the matrix, thereby depositing the titanium/tantalum/molybdenum disulfide/tungsten disulfide multi-layer gradient transition layer on the surface of the titanium transition layer.

In some preferred embodiments, the preparation method comprises: by adopting the magnetron sputtering technology, using the molybdenum disulfide target, the tungsten disulfide target and the tantalum target as negative electrode targets and using the inert gas as the work gas, applying a target current to the tantalum target, the molybdenum disulfide target and the tungsten disulfide target, and applying a negative bias to the matrix, thereby depositing the tantalum-doped molybdenum disulfide/tungsten disulfide multi-layer layer on the surface of the titanium/tantalum/molybdenum disulfide/tungsten disulfide multi-layer gradient transition layer.

The embodiment of the present application also provides use of the above tantalum-doped molybdenum disulfide/tungsten disulfide multi-layer film in the field of surface protection of aerospace components.

The embodiment of the present application also provides a device, comprising the matrix, wherein the tantalum-doped molybdenum disulfide/tungsten disulfide multi-layer film is also arranged on the matrix.

Compared with the prior art, the present application at least has the following beneficial effects:

(1) the tantalum-doped molybdenum disulfide/tungsten disulfide multi-layer film provided by the present application has good matrix binding strength, hardness and elasticity modulus, has good friction and abrasion performance under an atmospheric environment (60±3% RH) at different temperatures, has good temperature self-adopting performance, heat and humidity resistance and high temperature oxidization resistance, and can meet the requirements of stable lubrication and long-life service of aerospace vehicles;

(2) the alternating growth of superlattices in the tantalum-doped molybdenum disulfide/tungsten disulfide multi-layer film can interrupt the continuous growth of monolayers in the same composition, the doping of tantalum can further change the structure growth of the film so that an incomplete multi-layer alternating structure is optimized into a complete multi-layer alternating structure, and the preferred orientation of the (002) face is realized, so as to facilitate the formation of a dense structure and reduction of defects and improve the mechanical performance and corrosion resistance of the film;

(3) the interface in the tantalum-doped molybdenum disulfide/tungsten disulfide multi-layer film can not only improve the mechanical performance through preventing dislocation movement but also effectively prevent the diffusion of $H_2O$, $O_2$, $Cl^-$ and $Na^+$ corrosion particles so as to improve oxidization resistance and corrosion resistance, and a proper amount of tantalum can improve the self-adopting performance and electrochemical corrosion resistance of the film to obtain the tantalum-doped molybdenum disulfide/tungsten disulfide multi-layer film with the best comprehensive lubricating property.

BRIEF DESCRIPTION OF THE DRAWINGS

For more clearly illustrating the embodiments of the present application or the technical solution in the prior art, the drawings required to be used in the embodiments or in the description of the prior art will be discussed below. Obviously, the drawings in the following description are some embodiments of the present application, and other drawings can be made by those skilled in the art without creative efforts according to these drawings.

DETAILED DESCRIPTION OF THE EMBODIMENTS

In view of the defects in the prior art, the inventors of this case, via long-term researches and lots of practices, provide the technical solution of the present application. The provided is a tantalum-doped molybdenum disulfide/tungsten disulfide multi-layer film which has long service life, good anti-oxidization property, and good mechanical and abrasion properties at the atmosphere under a high temperature environment and is formed by doping tantalum element based on molybdenum disulfide/tungsten disulfide multilayers as a main body. Next, this technical solution, its implementation process and principle and the like will be further explained.

As one aspect of the technical solution of the present application, provided is a tantalum-doped molybdenum disulfide/tungsten disulfide multi-layer film, comprising a titanium transition layer, a titanium/tantalum/molybdenum disulfide/tungsten disulfide multi-layer gradient transition layer and a tantalum-doped molybdenum disulfide/tungsten disulfide multi-layer layer which are successively laminated in the thickness direction of the tantalum-doped molybdenum disulfide/tungsten disulfide multi-layer film.

In some preferred embodiments, the percent content of tantalum (Ta) atoms in the tantalum-doped molybdenum disulfide/tungsten disulfide multi-layer film is 0.7-4.4%.

Further, the thickness of the titanium transition layer is 80-120 nm.

Further, the thickness of the titanium/tantalum/molybdenum disulfide/tungsten disulfide multi-layer gradient transition layer is 130-170 nm.

Further, the thickness of the tantalum-doped molybdenum disulfide/tungsten disulfide multi-layer layer is 2.0-2.5 μm.

Further, starting from the surface of the matrix, a titanium transition layer having a thickness of about 80-120 nm, a titanium/tantalum/molybdenum disulfide/tungsten disulfide multi-layer gradient transition layer having a thickness of about 130-170 nm and a tantalum-doped molybdenum disulfide/tungsten disulfide multi-layer layer having a thickness of about 2.0-2.5 μm are successively contained.

Further, the tantalum-doped molybdenum disulfide/tungsten disulfide multi-layer film has a hardness of more than 6 GPa.

Further, the tantalum-doped molybdenum disulfide/tungsten disulfide multi-layer film has a friction coefficient of 0.073-0.080 and an abrasion rate of $3.3 \times 10^{-6}$-$6.4 \times 10^{-6}$ mm$^3$/Nm under an atmospheric environment at room temperature, a friction coefficient of 0.030-0.042 and an abrasion rate of $3.1 \times 10^{-6}$-$5.3 \times 10^{-6}$ mm$^3$/Nm under the environment of 200° C., and a friction coefficient of 0.040-0.060 and an abrasion rate of $3.7 \times 10^{-6}$-$9.4 \times 10^{-6}$ mm$^3$/Nm under the environment of 400° C.

As another aspect of the technical solution of the present application, provided is a preparation method of the above tantalum-doped molybdenum disulfide/tungsten disulfide multi-layer film, comprising: successively depositing the titanium transition layer, the titanium/tantalum/molybdenum disulfide/tungsten disulfide multi-layer gradient transition layer and the tantalum-doped molybdenum disulfide/tungsten disulfide multi-layer layer on the surface of a matrix by adopting a magnetron sputtering technology to obtain the tantalum-doped molybdenum disulfide/tungsten disulfide multi-layer film.

In some preferred embodiments, the preparation method of the titanium transition layer comprises: by adopting the magnetron sputtering technology, using the titanium target as a negative electrode target and using an inert gas as a work gas, applying a target current to the titanium target, and applying a negative bias to the matrix, thereby depositing the titanium transition layer on the surface of the matrix, wherein the target current is 2.1-3.0 A, the bias of the matrix is −70 to −100 V, the flow of the work gas is 12-16 sccm, the temperature of the matrix is 80-120° C., the pressure of a reaction chamber is $1.0\text{-}3.0\times10^{-1}$ Pa, and the deposition time is 100-200 s.

Further, the inert gas is argon, but is not limited thereto.

Further, the thickness of the titanium transition layer is 80-120 nm.

In some embodiments, the preparation method of the gradient transition layer comprises: by adopting the magnetron sputtering technology, using the titanium target, the molybdenum disulfide target, the tungsten disulfide target and the tantalum target as negative electrode targets and using the inert gas as the work gas, applying a target current to the titanium target, the molybdenum disulfide target, the tungsten disulfide target and the tantalum target, and applying a negative bias to the matrix, thereby depositing the titanium/tantalum/molybdenum disulfide/tungsten disulfide multi-layer gradient transition layer on the surface of the titanium transition layer, wherein the target current applied to the titanium target is decreased from 2.1-3.0 A to 0, the sputtering power applied to the molybdenum disulfide target and the tungsten disulfide target is gradually increased from 0 to 0.73-0.97 kW, the target current applied to the tantalum target is gradually increased from 0 to 0.1-0.4 A, the bias of the matrix is −30 to −70 V, the flow of the work gas is 12-16 sccm, the temperature of the matrix is 80-120° C., the pressure of the reaction chamber is $1.0\text{-}3.0\times10^{-1}$ Pa, and the deposition time is 100-120 s.

Further, the inert gas is argon, but is not limited thereto.

Further, the thickness of the tantalum-doped molybdenum disulfide/tungsten disulfide multi-layer gradient transition layer is 130-170 nm.

In some embodiments, the preparation method comprises: by adopting the magnetron sputtering technology, using the molybdenum disulfide target, the tungsten disulfide target, the tantalum target as negative electrode targets and using the inert gas as the work gas, applying a target current to the tantalum target, the molybdenum disulfide target and the tungsten disulfide target, and applying a negative bias to the matrix, thereby depositing the tantalum-doped molybdenum disulfide/tungsten disulfide multi-layer layer on the surface of the titanium/tantalum/molybdenum disulfide/tungsten disulfide multi-layer gradient transition layer, wherein the sputtering current applied to the titanium target is gradually reduced to 0, the sputtering power applied to the molybdenum disulfide target and the tungsten disulfide target is 0.73-0.97 kW, the target current applied to the tantalum target is decreased from 0.1-0.4 A, the bias of the matrix is −30 to −70 V, the flow of the work gas is 12-16 sccm, the temperature of the matrix is 80-120° C., the pressure of the reaction chamber is $1.0\text{-}3.0\times10^{-1}$ Pa, and the deposition time is 6500-8000 s;

Further, the inert gas is argon, but is not limited thereto.

Further, the thickness of the tantalum-doped molybdenum disulfide/tungsten disulfide multi-layer layer is 2.0-2.5 μm.

Where, in some more specific embodiments, the preparation method of the tantalum-doped molybdenum disulfide/tungsten disulfide multi-layer film adopts magnetron sputtering deposition, particularly comprising the following steps:

(1) the sputtering current of the titanium target is 3.0 A, the bias of the matrix is −70 to −100 V, the work gas is Ar, the flow of the work gas is 12-16 sccm, the temperature of the deposited matrix is 80-120° C., the pressure is $1.0\text{-}3.0\times10^{-1}$ Pa, the deposition time is 100-120 s, and the titanium transition layer is deposited on the surface of the matrix;

(2) the sputtering current of the titanium target is gradually decreased to 0 A and meanwhile the sputtering power of the molybdenum disulfide and tungsten disulfide multi-later target is gradually increased to 0.73-0.97 kW, the sputtering current of the tantalum target is increased to 0.1-0.4 A, the work gas is Ar, the flow of the gas is 12-16 sccm, the bias of the matrix is −3- to −70 V, the temperature of the deposited matrix is 80-120° C., the pressure is $1.0\text{-}3.0\times10^{-1}$ Pa, and the deposition time is 100-120 s, the thickness of the titanium/tantalum/molybdenum disulfide/tungsten disulfide multi-layer gradient transition layer deposited on the surface of the titanium transition layer is 130-170 nm; and (3) the sputtering power of the molybdenum disulfide and tungsten disulfide target is maintained to 0.73-0.97 kW, the current of the tantalum target is maintained to 0.1-0.4 A, until the total thickness of the tantalum-doped molybdenum disulfide/tungsten disulfide multi-layer layer reaches 2.0-2.5 μm.

In some embodiments, the preparation method also comprises: the reaction chamber is pre-vacuumized to a vacuum degree of less than $3\times10^{-3}$ Pa.

Further, the preparation method also comprises: after the reaction chamber is pre-vacuumized to a vacuum degree of (less than $3\times10^{-3}$ Pa), the surface of the matrix is washed, plasma etching treatment is then performed, and the specific plasma etching method is as follows: a bias of −400 to −450 V is applied to the matrix, the temperature of the matrix is 100-150° C., and the etching time is 1200-1800 s.

Further, the matrix material is not limited, and can be nickel-based 718 high temperature steel or monocrystalline silicon wafer or the like, but is not limited thereto.

As another aspect of the technical solution of the present application, provided is the tantalum-doped molybdenum disulfide/tungsten disulfide multi-layer film prepared by the above method.

As yet another aspect of the technical solution of the present application, provided is use of the above tantalum-doped molybdenum disulfide/tungsten disulfide multi-layer film in the field of surface protection of aerospace components under the atmospheric environment.

Further, the matrix material is not limited, and can be nickel-based 718 high temperature steel or monocrystalline silicon wafer, etc., but is not limited thereto.

As still another aspect of the technical solution of the present application, provided is a device, comprising a matrix, wherein the above tantalum-doped molybdenum disulfide/tungsten disulfide multi-layer film is also arranged on the matrix.

Further, the matrix material is not limited, and can be nickel-based 718 high temperature steel or the monocrystalline silicon wafer or the like, but is not limited thereto.

Further, the device comprises an aerospace vehicle, but is not limited thereto.

The inventors of this case perform performance test on the above prepared tantalum-doped molybdenum disulfide/tungsten disulfide multi-layer film:

(1) the hardness and elasticity modulus of the film are measured by using an MTS NanoIndenter G200 nano indentation instrument system. A diamond indenter is used, the pressing depth is 1/10 of the thickness of the film and is 200 nm, and the average value of six points is calculated. Test results: the nano hardness of the tantalum-doped molybdenum disulfide/tungsten disulfide multi-layer film of the present application is more than 6 GPa.

(2) Friction and abrasion test: a CSM friction test machine is used, atmospheric humidity is 60±3% RH, and test temperatures are 25° C., 200° C. and 400° C. respectively for tribology performance analysis. A GCr15 steel ball is used as a counterpart, a reciprocate sliding manner is used, a frequency is 5 Hz, the length of a track is 5 mm, the operating time is 1800 s, and normal load is 5 N. The abraded cross section is measured via laser confocal, the abraded cross section is multiplied by operation step size to obtain an abrasion volume, and the abrasion volume is divided by load and stroke to obtain an abrasion rate. Test results: the optimized film of the present application has a friction coefficient of 0.075 and an abrasion rate of $3.3 \times 10^{-6}$ mm$^3$/Nm under an atmospheric environment at room temperature; a friction coefficient of 0.035 and an abrasion rate of $3.1 \times 10^{-6}$ mm$^3$/Nm under the environment of 200° C.; and a friction coefficient of 0.045 and an abrasion rate of $3.7 \times 10^{-6}$ mm$^3$/Nm under the environment of 400° C.

To sum up, by virtue of the above technical solution, the tantalum-doped molybdenum disulfide/tungsten disulfide multi-layer film provided by the present application has good matrix binding strength, hardness and elasticity modulus, has good friction and abrasion performance under the atmospheric environment (60±3% RH) at different temperatures, has good temperature adaptive property, humidity and heat resistance and high temperature oxidation resistance, and can meet the lubrication stability and long-life service requirements of aerospace vehicles.

Next, the technical solution of the present application will be further explained in detail in combination with several embodiments and drawings. Obviously, described embodiments are only a part of embodiments of the present application, but not all the embodiments. It is noted that the following embodiments are intended to understand the present application, but not limit the present application. Based on the embodiments of the present application, all other embodiments obtained by persons of ordinary skill in the art without creative efforts are included within the protective scope of the present application. Test methods without specific conditions are not noted in the following examples, and conducted according to conventional conditions.

Example 1

In this example, the matrix was nickel-based 718 high temperature steel or silicon wafer. A tantalum-doped molybdenum disulfide/tungsten disulfide multi-layer film was prepared on the surface of the matrix by using a magnetron sputtering technology, and main steps were as follows:

The surface of the matrix was mechanically polished, and the matrix material was subjected to ultrasonic washing for 15 min in an acetone solution, blow-dried with nitrogen, then subjected to ultrasonic washing for 15 min in an absolute ethyl alcohol solution, and then blow-dried with nitrogen.

The washed matrix was put into a magnetron sputtering cavity, the magnetron sputtering cavity was vacuumized to a vacuum degree of less than $3 \times 10^{-5}$ Pa, then the target was sputtered and washed for 5 min, a bias of −400 V was applied to a matrix sample, plasma etching was conducted for 30 min, and the temperature of the matrix was 100° C.

The tantalum-doped molybdenum disulfide/tungsten disulfide multi-layer film was prepared and deposited, the cavity was filled with high-pure argon, a Ti target (purity: 99.99 at. %), a MoS$_2$ target (purity: 99.9 at. %), a WS$_2$ target (purity: 99.9 at. %) and a Ta target (purity: 99.99 at. %) were used for arrangement. The magnetron sputtering technology was used, and specific steps were as follows:

the sputtering current of the titanium target was 3.0 A, the bias of the matrix was −70 V, the work gas was Ar, the flow of the work gas was 16 sccm, the temperature of the deposited matrix was 80° C., the pressure was $1.0 \times 10^{-1}$ Pa, the deposition time was 120 s, and the titanium transition layer, with a thickness of 120 nm, was deposited on the surface of the matrix;

(2) the sputtering current of the titanium target was gradually decreased to 0 A, and meanwhile the sputtering power of a molybdenum disulfide and tungsten disulfide multi-layer target was gradually increased to 0.97 kW, the sputtering current of the tantalum target was increased to 0.1 A, the work gas was Ar, the flow of the gas was 16 sccm, the bias of the matrix was −30 V, the temperature of the deposited matrix was 100° C., the pressure was $1.0 \times 10^{-1}$ Pa, and the deposition time was 120 s, and the titanium/tantalum/molybdenum disulfide/tungsten disulfide multi-layer gradient transition layer, with a thickness of 130 nm, was deposited on the surface of the titanium transition layer; and (3) the sputtering power of the molybdenum disulfide and tungsten disulfide target was maintained to 0.73 kW, the current of the tantalum target was maintained to 0.1 A, the rest conditions were not changed, and the deposition time was 6500 s, until the total thickness of the tantalum-doped molybdenum disulfide/tungsten disulfide multi-layer layer reached 2.0 μm.

The specific component parameters of the prepared tantalum-doped molybdenum disulfide/tungsten disulfide multi-layer film sample are shown in Table 1.

The above tantalum-doped molybdenum disulfide/tungsten disulfide multi-layer film prepared after deposition treatment was tested as follows:

(1) Mechanical Performance Test the hardness and elasticity modulus of the film were measured by using an MTS NanoIndenter G200 nano indentation instrument system. A diamond indenter was used, the pressing depth was 1/10 of the thickness of the film and was 200 nm, and the average value of six points was calculated. Test results are shown in Table 2.

(2) Friction and Abrasion Performance Test Under Atmospheric Environment (60±3% RH) at Different Temperatures The tribological performance analysis was conducted using a CSm friction tester, and carried out under the atmospheric humidity of 60±3% RH at the test temperatures of 25° C., 200° C. and 400° C. The GCr15 steel ball was used as the counterpart, the reciprocating sliding manner was used, the frequency was 5 Hz, the length of the track was 5 mm, the operating time was 1800 s, and the normal load was 5 N. The abrasion volume was measured via laser confocal, and the abrasion volume was divided by the load and stroke to obtain the abrasion rate. Test results of the friction coefficient and the abrasion rate are shown in Table 3 and Table 4, respectively.

Example 2

In this example, the matrix material was nickel-based 718 high temperature steel or silicon wafer. A tantalum-doped molybdenum disulfide/tungsten disulfide multi-layer film was prepared on the surface of a matrix by using a magnetron sputtering technology, and main steps were as follows.

The surface of the matrix was mechanically polished, and the matrix was subjected to ultrasonic washing for 15 min in an acetone solution, blow-dried with nitrogen, then subjected to ultrasonic washing for 15 min in an absolute ethyl alcohol solution, and then blow-dried with nitrogen.

The washed matrix was put into a magnetron sputtering cavity, the magnetron sputtering cavity was vacuumized to a vacuum degree of less than $3 \times 10^{-1}$ Pa, then the target was sputtered and washed for 5 min, a bias of −450 V was applied to a matrix sample, plasma etching was conducted for 20 min, and the temperature of the matrix was 150° C.

The tantalum-doped molybdenum disulfide/tungsten disulfide multi-layer film was prepared and deposited, the cavity was filled with high-pure argon, a Ti target (purity: 99.99 at. %), a MoS$_2$ target (purity: 99.9 at. %), a WS$_2$ target (purity: 99.9 at. %) and a Ta target (purity: 99.99 at. %) were used for arrangement. The magnetron sputtering technology was used, and specific steps were as follows:

the sputtering current of the titanium target was 2.5 A, the bias of the matrix was −100 V, the work gas was Ar, the flow of the work gas was 12 sccm, the temperature of the deposited matrix was 120° C., the pressure was 3.0×10$^{-1}$ Pa, the deposition time was 100 s, and the titanium transition layer, with a thickness of 100 nm, was deposited on the surface of the matrix;

(2) the sputtering current of the titanium target was gradually decreased to 0 A, and meanwhile the sputtering power of the molybdenum disulfide and tungsten disulfide multi-layer target was gradually increased to 0.73 kW, the sputtering current of the tantalum target was increased to 0.2 A, the work gas was Ar, the flow of the gas was 12 sccm, the bias of the matrix was −50 V, the temperature of the deposited matrix was 80° C., the pressure was 3.0×10$^{-1}$ Pa, and the deposition time was 110 s, and the titanium/tantalum/molybdenum disulfide/tungsten disulfide multi-layer gradient transition layer, with a thickness of 170 nm, was deposited on the surface of the titanium transition layer; and (3) the sputtering power of the molybdenum disulfide and tungsten disulfide target was maintained to 0.87 kW, the current of the tantalum target was maintained to 0.2 A, the rest conditions were not changed, and the deposition time was 7000 s, until the total thickness of the tantalum-doped molybdenum disulfide/tungsten disulfide multi-layer layer reached 2.2 μm.

The specific component parameters of the prepared tantalum-doped molybdenum disulfide/tungsten disulfide multi-layer film sample are shown in Table 1.

Figure 1A:
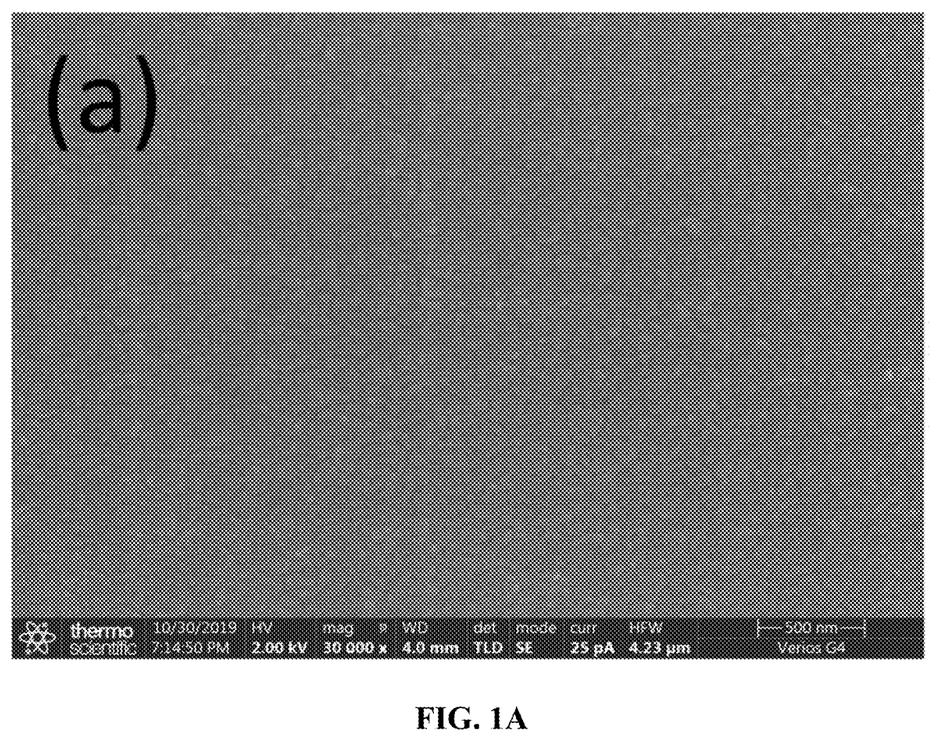
FIGS. 1A-1C are scanning electron microscope (SEM) graphs of a surface and a cross section of a tantalum-doped molybdenum disulfide/tungsten disulfide multi-layer film prepared according to example 2 of the present application.
Figure 1B:
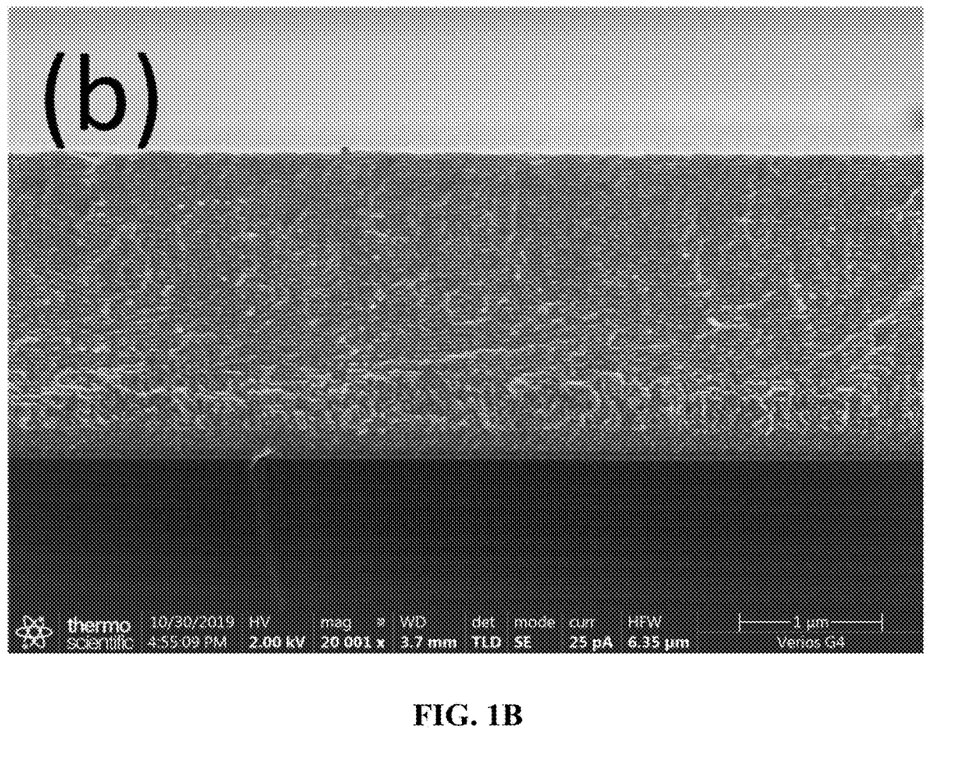
Figure 1C:
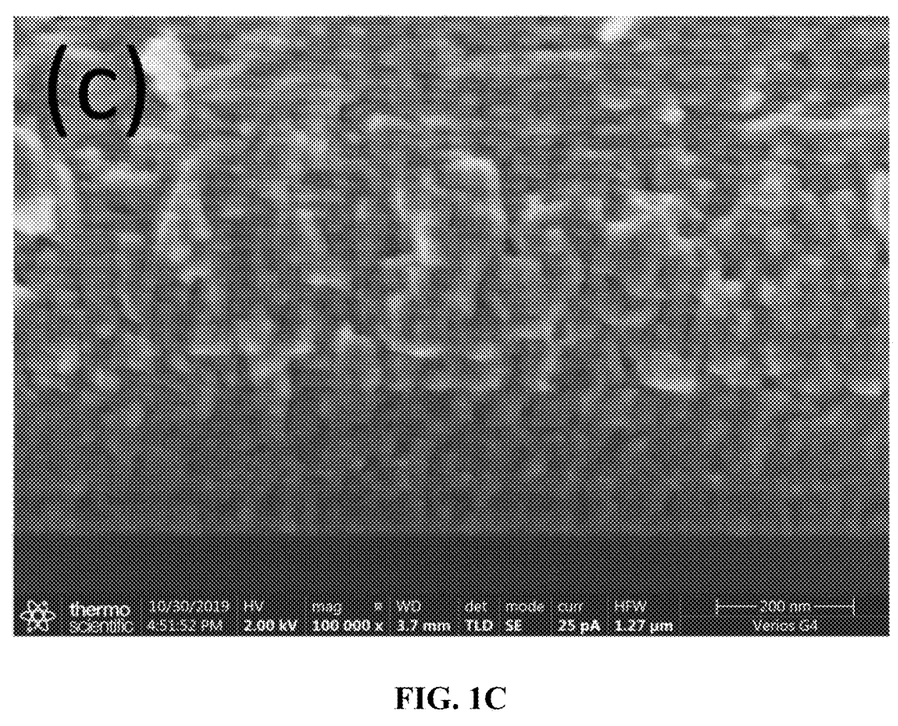

The above tantalum-doped molybdenum disulfide/tungsten disulfide multi-layer film prepared after deposition treatment was tested as follows:

(1) Structure Test:

Test results are shown in FIGS. 1A-1C. The thickness of the Ti transition layer of the film was about 80-120 nm, the thickness of the titanium/tantalum/molybdenum disulfide/tungsten disulfide multi-layer gradient transition layer was about 130-170 nm, and the thickness of the tantalum-doped molybdenum disulfide/tungsten disulfide multi-layer film was 2.0-2.5 μm.

(2) Mechanical Performance Test:

the hardness and elasticity modulus of the film were measured by using an MTS NanoIndenter G200 nano indentation instrument system. A diamond indenter was used, the pressing depth was 1/10 of the thickness of the film and was 200 nm, and the average value of six points was calculated. Test results are shown in Table 2.

(3) Friction and Abrasion Performance Test Under the Atmospheric Environment (60±3% RH) at Different Temperatures The tribological performance analysis was conducted using a CSm friction tester, and carried out under the atmospheric humidity of 60±3% RH at the test temperatures of 25° C., 200° C. and 400° C. The GCr15 steel ball was used as the counterpart, the reciprocating sliding manner was used, the frequency was 5 Hz, the length of the track was 5 mm, the operating time was 1800 s, and the normal load was 5 N. The abrasion volume was measured via laser confocal, and the abrasion volume was divided by the load and stroke to obtain the abrasion rate. Test results of the friction coefficient and the abrasion rate are shown in Table 3 and Table 4, respectively.

Example 3

In this example, the matrix was nickel-based 718 high temperature steel or silicon wafer. A tantalum-doped molybdenum disulfide/tungsten disulfide multi-layer film was prepared on the surface of a matrix by using a magnetron sputtering technology, and main steps were as follows:

The surface of the matrix was mechanically polished, and the matrix was subjected to ultrasonic washing for 15 min in an acetone solution, blow-dried with nitrogen, then subjected to ultrasonic washing for 15 min in an absolute ethyl alcohol solution, and then blow-dried with nitrogen.

The washed matrix was put into a magnetron sputtering cavity, the magnetron sputtering cavity was vacuumized to a vacuum degree of less than 3×10$^{-1}$ Pa, then the target was sputtered and washed for 5 min, a bias of −420 V was applied to a matrix sample, plasma etching was conducted for 25 min, and the temperature of the matrix was 130° C.

The tantalum-doped molybdenum disulfide/tungsten disulfide multi-layer film was prepared and deposited, the cavity was filled with high-pure argon, a Ti target (purity: 99.99 at. %), a MoS$_2$ target (purity: 99.9 at. %), a WS$_2$ target (purity: 99.9 at. %) and a Ta target (purity: 99.99 at. %) were used for arrangement. The magnetron sputtering technology was used, and specific steps were as follows:

the sputtering current of the titanium target was 2.1 A, the bias of the matrix was −80 V, the work gas was Ar, the flow of the work gas was 14 sccm, the temperature of the deposited matrix was 100° C., the pressure was 2.0×10$^{-1}$ Pa, the deposition time was 110 s, and the titanium transition layer, with a thickness of 80 nm, was deposited on the surface of the matrix;

(2) the sputtering current of the titanium target was gradually decreased to 0 A, and meanwhile the sputtering power of the molybdenum disulfide and tungsten disulfide multi-layer target was gradually increased to 0.85 kW, the sputtering current of the tantalum target was increased to 0.4 A, the work gas was Ar, the flow of the gas was 14 sccm, the bias of the matrix was −70 V, the temperature of the deposited matrix was 120° C., the pressure was 2.0×10$^{-1}$ Pa, and the deposition time was 100 s, and the titanium/tantalum/molybdenum disulfide/tungsten disulfide multi-layer gradient transition layer, with a thickness of 150 nm, was deposited on the surface of the titanium transition layer; and (3) the sputtering power of the molybdenum disulfide and tungsten disulfide target was maintained to 0.97 kW, the current of the tantalum target was maintained to 0.4 A, the rest conditions were not changed, and the deposition time was 8000 s, until the total thickness of the tantalum-doped molybdenum disulfide/tungsten disulfide multi-layer layer reached 2.5 μm.

The specific component parameters of the prepared tantalum-doped molybdenum disulfide/tungsten disulfide multi-layer film sample are shown in Table 1.

The above tantalum-doped molybdenum disulfide/tungsten disulfide multi-layer film prepared after deposition treatment was tested as follows:

(1) Mechanical Performance Test:

the hardness and elasticity modulus of the film were measured by using an MTS NanoIndenter G200 nano indentation instrument system. A diamond indenter was used, the pressing depth was 1/10 of the thickness of the film and was 200 nm, and the average value of six points was calculated. Test results are shown in Table 2.

(2) Friction and Abrasion Performance Test Under the Atmospheric Environment (60±3% RH) at Different Temperatures The tribological performance analysis was conducted using a CSm friction tester, and carried out under the atmospheric humidity of 60±3% RH at the test temperatures of 25° C., 200° C. and 400° C. The GCr15 steel ball was used as the counterpart, the reciprocating sliding manner was used, the frequency was 5 Hz, the length of the track was 5 mm, the operating time was 1800 s, and the normal load was 5 N. The abrasion volume was measured via laser confocal, and the abrasion volume was divided by the load and stroke to obtain the abrasion rate. Test results of the friction coefficient and the abrasion rate are shown in Table 3 and Table 4, respectively.

Comparative Example 1

In this example, the matrix was nickel-based 718 high temperature steel or silicon wafer. A tantalum-doped molybdenum disulfide/tungsten disulfide multi-layer film was prepared on the surface of a matrix by using a magnetron sputtering technology, and main steps were as follows:

The surface of the matrix was mechanically polished, and the matrix was subjected to ultrasonic washing for 15 min in an acetone solution, blow-dried with nitrogen and then subjected to ultrasonic washing for 15 min in an absolute ethyl alcohol solution, and then blow-dried with nitrogen.

The washed matrix was put into a magnetron sputtering cavity, the magnetron sputtering cavity was vacuumized to a vacuum degree of less than $3 \times 10^{-5}$ Pa, then the target was sputtered and washed for 5 min, and plasma etching was conducted on a matrix sample for 30 min.

The tantalum-doped molybdenum disulfide/tungsten disulfide multi-layer film was prepared and deposited, the cavity was filled with high-pure argon, a Ti target (purity: 99.99 at. %), a $MoS_2$ target (purity: 99.9 at. %), a $WS_2$ target (purity: 99.9 at. %) and a Ta target (purity: 99.99 at. %) were used for arrangement. The magnetron sputtering technology was used, and specific steps were as follows:

the sputtering current of the titanium target was 3.0 A, the bias of the matrix was −70 to −100 V, the work gas was Ar, the flow of the work gas was 16 sccm, the temperature of the deposited matrix was 80-120° C., the pressure was $1.0$-$3.0 \times 10^{-1}$ Pa, the deposition time was 120 s, and the titanium transition layer was deposited on the surface of the matrix;

(2) the sputtering current of the titanium target was gradually decreased to 0 A, and meanwhile the sputtering power of the molybdenum disulfide and tungsten disulfide multi-layer target was gradually increased to 0.97 kW, the work gas was Ar, the flow of the gas was 16 sccm, the bias of the matrix was −30 to −70 V, the temperature of the deposited matrix was 80-120° C., the pressure was $1.0$-$3.0 \times 10^{-1}$ Pa, and the deposition time was 120 s, and the titanium/tantalum/molybdenum disulfide/tungsten disulfide multi-layer gradient transition layer, with a thickness of 130-170 nm, was deposited on the surface of the titanium transition layer was 130-170 nm; and (3) the sputtering power of the molybdenum disulfide and tungsten disulfide target was maintained to 0.97 kW, until the total thickness of the tantalum-doped molybdenum disulfide/tungsten disulfide multi-layer layer reached 2.0-2.5 μm.

The specific component parameters of the prepared tantalum-doped molybdenum disulfide/tungsten disulfide multi-layer film sample are shown in Table 1.

The above tantalum-doped molybdenum disulfide/tungsten disulfide multi-layer film prepared after deposition treatment was tested as follows:

(1) Mechanical Performance Test:

the hardness and elasticity modulus of the film were measured by using an MTS NanoIndenter G200 nano indentation instrument system. A diamond indenter was used, the pressing depth was 1/10 of the thickness of the film and was 200 nm, and the average value of six points was calculated. Test results are shown in Table 2.

(2) Friction and Abrasion Performance Test Under the Atmospheric Environment (60±3% RH) at Different Temperatures The tribological performance analysis was conducted using a CSm friction tester, and carried out under the atmospheric humidity of 60±3% RH at the test temperatures of 25° C., 200° C. and 400° C. The GCr15 steel ball was used as the counterpart, the reciprocating sliding manner was used, the frequency was 5 Hz, the length of the track was 5 mm, the operating time was 1800 s, and the normal load was 5 N. The abrasion volume was measured via laser confocal, and the abrasion volume was divided by the load and stroke to obtain the abrasion rate. Test results of the friction coefficient and the abrasion rate are shown in Table 3 and Table 4, respectively.

The element contents of four films prepared through different Ta target currents in examples 1-3 and comparative example 1 are shown in Table 1, and named as $MoS_2/WS_2$, $MoS_2/WS_2$-0.7 at. % Ta, $MoS_2/WS_2$-1.8 at. % Ta and $MoS_2/WS_2$-4.4 at. % Ta according to the atom percentage of the Ta element as follows.

TABLE 1

Component parameter table of $MoS_2/WS_2$—Ta film sample

| Sample | O (at. %) | Ta (at. %) | S (at. %) | Mo (at. %) | W (at. %) |
|---|---|---|---|---|---|
| $MoS_2/WS_2$ | 4.3 | — | 61.3 | 17.0 | 17.4 |
| $MoS_2/WS_2$-0.7 at. % Ta | 4.3 | 0.7 | 58.7 | 18.2 | 18.8 |
| $MoS_2/WS_2$-1.8 at. % Ta | 4.1 | 1.8 | 48.4 | 23.3 | 22.3 |
| $MoS_2/WS_2$-4.4 at. % Ta | 3.6 | 4.4 | 53.4 | 19.4 | 19.2 |

It can be seen from Table 1 that all the oxygen contents of the deposited films are relatively low, and the main bodies are $MoS_2$ and $WS_2$, which meets the requirement on a film having a lubricating function.

The surface of the four film samples in examples 1-3 and comparative example 1 were pressed into six points with a depth of 200 nm through a nano indentation device, and the hardness and elastic modulus were measured. The results are shown in Table 2 below. It can be seen from Table 2 that the hardness of three tantalum-doped molybdenum disulfide/tungsten disulfide multi-layer films are all more than 6 GPa. Among them, the $MoS_2/WS_2$-1.8 at. % Ta film has the best mechanical properties.

Figure 2:
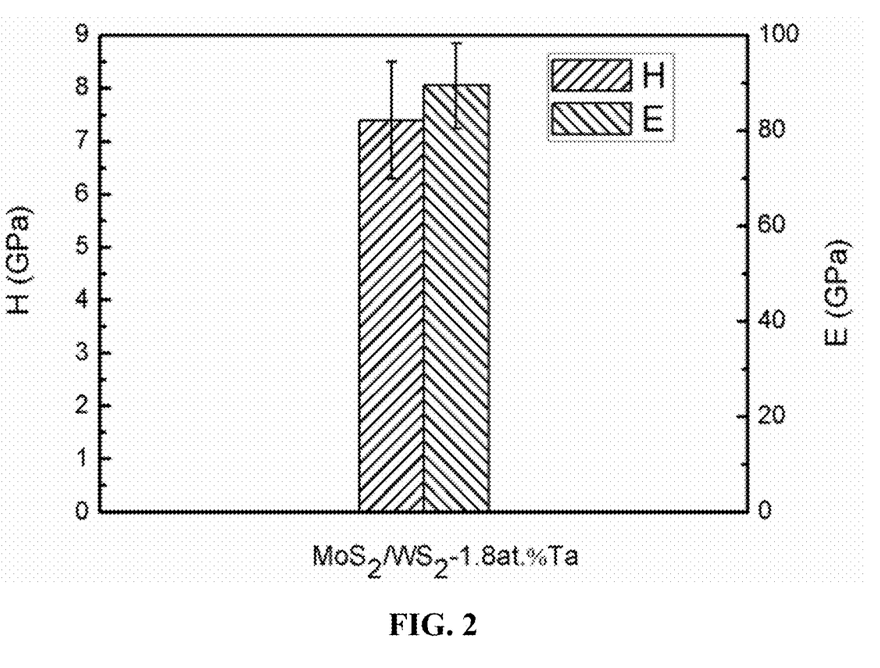
FIG. 2 is a hardness and elasticity modulus test graph of a tantalum-doped molybdenum disulfide/tungsten disulfide multi-layer film prepared according to example 2 of the present application.

FIG. 2 is a hardness and elasticity modulus test graph of a tantalum-doped molybdenum disulfide/tungsten disulfide multi-layer film prepared according to example 2 of the present application.

TABLE 2

Hardness and elasticity modulus table of $MoS_2/WS_2$—Ta film sample

| Sample | Hardness (GPa) | Elasticity modulus (GPa) |
|---|---|---|
| $MoS_2/WS_2$ | 4.8 | 63.5 |
| $MoS_2/WS_2$-0.7 at. % Ta | 6.3 | 79.4 |
| $MoS_2/WS_2$-1.8 at. % Ta | 7.4 | 89.4 |
| $MoS_2/WS_2$-4.4 at. % Ta | 6.1 | 80.2 |

The friction coefficients of four films $MoS_2/WS_2$, $MoS_2/WS_2$-0.7 at. % Ta, $MoS_2/WS_2$-1.8 at. % Ta and $MoS_2/WS_2$-4.4 at. % Ta in examples 1-3 and comparative example 1 are shown in Table 3. $MoS_2/WS_2$-1.8 at. % Ta in example 2 has the best friction coefficients at 25° C., 200° C. and 400° C.

Figure 3:
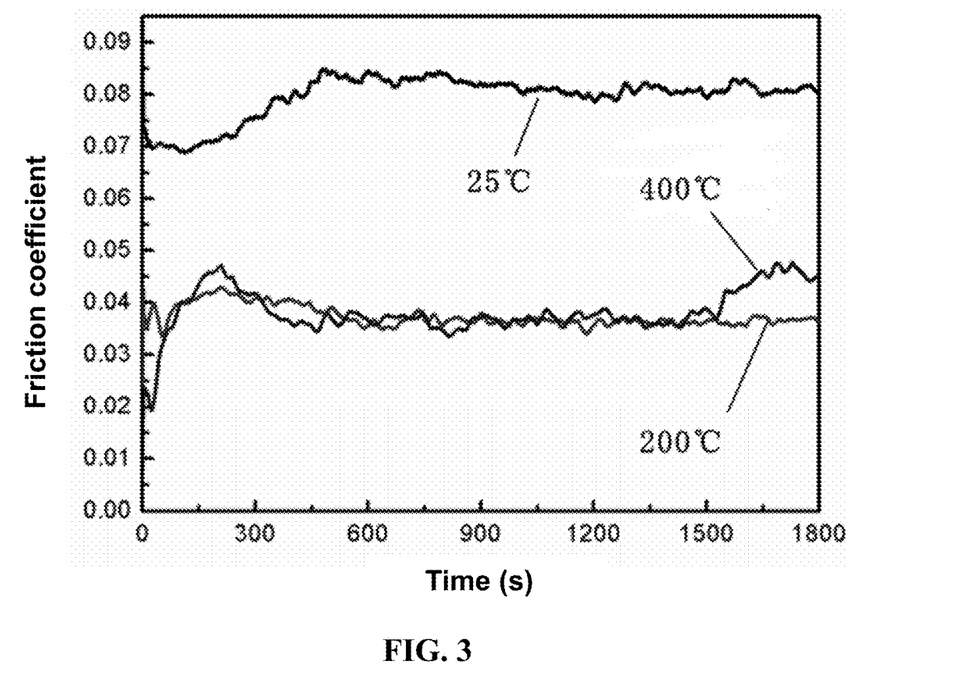
FIG. 3 is a friction coefficient graph of a tantalum-doped molybdenum disulfide/tungsten disulfide multi-layer film prepared according to example 2 of the present application under an atmospheric environment at different temperatures.

FIG. 3 is a friction coefficient graph of a $MoS_2/WS_2$-1.8 at. % Ta film prepared according to example 2 of the present application under an atmospheric environment at different temperatures.

TABLE 3

Friction coefficient table of $MoS_2/WS_2$-1.8 at. % Ta film samples

| Sample | 25° C. | 200° C. | 400° C. |
|---|---|---|---|
| $MoS_2/WS_2$ | 0.081 | 0.060 | 0.066 |
| $MoS_2/WS_2$-0.7 at. % Ta | 0.076 | 0.041 | 0.065 |
| $MoS_2/WS_2$-1.8 at. % Ta | 0.075 | 0.035 | 0.040 |
| $MoS_2/WS_2$-4.4 at. % Ta | 0.077 | 0.037 | 0.067 |

The friction coefficients of four films $MoS_2/WS_2$, $MoS_2/WS_2$-0.7 at. % Ta, $MoS_2/WS_2$-1.8 at. % Ta and $MoS_2/WS_2$-4.4 at. % Ta in examples 1-3 and comparative example 1 are shown in Table 4. $MoS_2/WS_2$-1.8 at. % Ta in example 2 has the lowest abrasion rates at 25° C., 200° C. and 400° C., and the abrasion rate is approximately stabilized to $3.0 \times 10^{-6}$ mm$^3$/Nm.

Figure 4:
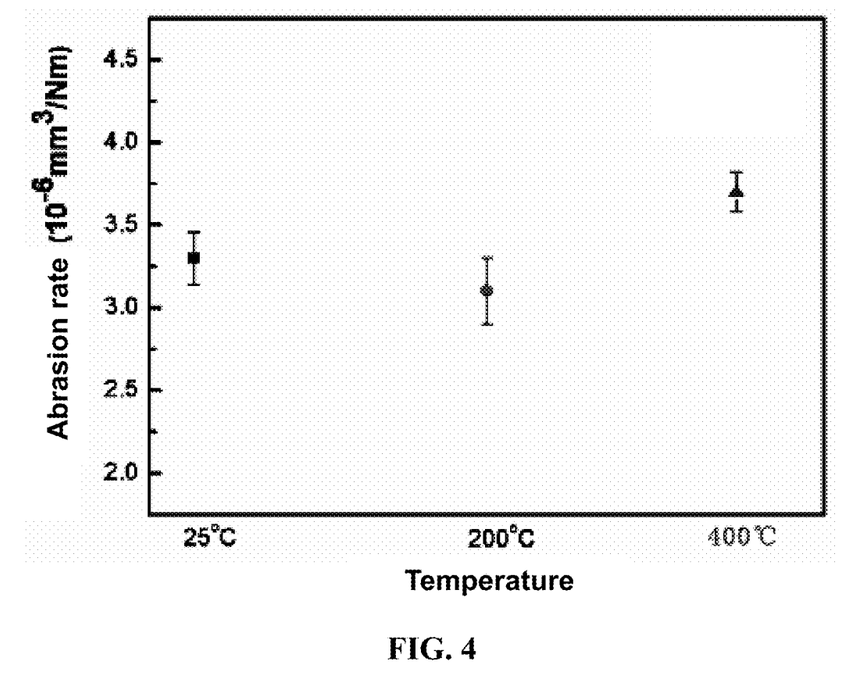
FIG. 4 is an abrasion rate graph of a tantalum-doped molybdenum disulfide/tungsten disulfide multi-layer film prepared according to example 2 of the present application under an atmospheric environment at different temperatures.

FIG. 4 is an abrasion rate graph of a $MoS_2/WS_2$-1.8 at. % Ta film prepared according to example 2 of the present application under an atmospheric environment at different temperatures.

TABLE 4

Abrasion rate table of $MoS_2/WS_2$—Ta film samples

| Sample | 25° C. | 200° C. | 400° C. |
|---|---|---|---|
| $MoS_2/WS_2$ | 11.2 | 9.4 | 18.3 |
| $MoS_2/WS_2$-0.7 at. % Ta | 6.4 | 5.3 | 8.3 |
| $MoS_2/WS_2$-1.8 at. % Ta | 3.3 | 3.1 | 3.7 |
| $MoS_2/WS_2$-4.4 at. % Ta | 5.9 | 4.8 | 9.4 |

The aspects, embodiments, features and examples of the present application should be regarded as being illustrative in all aspects and are not intended to limit the present application. The scope of the present application is only defined by the claims. Without departing from the spirit and scope of the claimed application, those skilled in the art will understand other embodiments, modifications, and uses.

The use of titles and chapters in the present application is not meant to limit the present application; each chapter can be applied to any aspect, embodiment, or feature of the present application.

Throughout the present application, where a composition is described as having, containing, or including specific component parameters, or where a process is described as having, containing, or including specific process steps, it is expected that the composition taught in the present application is also basically The above description consists of or is composed of the described components, and the process taught in the present application is basically composed of the described process steps or a set of described process steps.

Unless specifically stated otherwise, the use of the terms "include, includes, including" and "have, has, or having" should generally be understood as open-ended and not restrictive.

It should be understood that the order of the steps or the order of performing specific actions is not very important, as long as the teachings of the present application remain operable. In addition, two or more steps or actions can be performed simultaneously.

In addition, the inventor of this case also refers to the foregoing embodiments, conducted experiments with other raw materials, process operations, and process conditions described in this specification, and obtained relatively ideal results.

Although the present application has been described with reference to illustrative embodiments, those skilled in the art will understand that various other changes, omissions and/or additions can be made without departing from the spirit and scope of the present application, and the essence, etc. The effector replaces the elements of the described embodiment. In addition, many modifications can be made to adapt specific situations or materials to the teachings of the present application without departing from the scope of the present application. Therefore, this article does not intend to limit the application to the specific embodiments disclosed for implementing the present application, but intends that the present application will include all embodiments falling within the scope of the appended claims. In addition, unless specifically stated otherwise, any use of the terms first, second and the like does not indicate any order or importance, but rather uses the terms first, second and the like to distinguish one element from another element.

What is claimed is:

1. A tantalum-doped molybdenum disulfide/tungsten disulfide ($MoS_2/WS_2$) multi-layer film, comprising a titanium layer, a titanium/tantalum/molybdenum disulfide/tungsten disulfide ($Ti/Ta/MoS_2/WS_2$) gradient transition layer, and a tantalum-doped molybdenum disulfide/tungsten disulfide ($MoS_2/WS_2$) layer,
wherein the titanium layer, the $Ti/Ta/MoS_2/WS_2$ gradient transition layer, and the tantalum-doped $MoS_2/WS_2$ layer are successively laminated in a thickness direction of the tantalum-doped $MoS_2/WS_2$ multi-layer film.

2. The tantalum-doped $MoS_2/WS_2$ multi-layer film according to claim 1, wherein a percent content of tantalum atoms in the tantalum-doped $MoS_2/WS_2$ multi-layer film is 0.7-4.4%.

3. The tantalum-doped $MoS_2/WS_2$ multi-layer film according to claim 1, wherein
a thickness of the titanium layer is 80-120 nm; and/or
a thickness of the $Ti/Ta/MoS_2/WS_2$ gradient transition layer is 130-170 nm; and/or
a thickness of the tantalum-doped $MoS_2/WS_2$ layer is 2.0-2.5 μm; and/or
the tantalum-doped $MoS_2/WS_2$ multi-layer film has a hardness of more than 6 GPa; and/or
the tantalum-doped $MoS_2/WS_2$ multi-layer film has a friction coefficient of 0.073-0.080 and an abrasion rate of $3.3 \times 10^{-6}$-$6.4 \times 10^{-6}$ mm$^3$/Nm under an atmospheric environment at room temperature, and the friction coefficient of 0.030-0.042 and the abrasion rate of $3.1\times10^{-6}$-$5.3\times10^{-6}$ mm³/Nm under an environment of 200° C., and the friction coefficient of 0.040-0.060 and the abrasion rate of $3.7\times10^{-6}$-$9.4\times10^{-6}$ mm³/Nm under an environment of 400° C.

4. A preparation method of the tantalum-doped MoS$_2$/WS$_2$ multi-layer film according to claim 1, comprising: successively depositing the titanium layer, the Ti/Ta/MoS$_2$/WS$_2$ gradient transition layer, and the tantalum-doped MoS$_2$/WS$_2$ layer on a surface of a matrix by adopting a magnetron sputtering technology to obtain the tantalum-doped MoS$_2$/WS$_2$ multi-layer film.

5. The preparation method according to claim 4, comprising:
by adopting the magnetron sputtering technology, using a titanium target as a negative electrode target and using an inert gas as a work gas,
applying a target current to the titanium target, and
applying a negative bias to the matrix, thereby depositing the titanium layer on the surface of the matrix,
wherein the target current is 2.1-3.0 A, the negative bias of the matrix is −70 to −100 V, a flow of the work gas is 12-16 sccm, a temperature of the matrix is 80-120° C., a pressure of a reaction chamber is $1.0$-$3.0\times10^{-1}$ Pa, and a deposition time is 100-200 s; the inert gas is argon; a thickness of the titanium layer is 80-120 nm.

6. The preparation method according to claim 4, comprising:
by adopting the magnetron sputtering technology, using a first titanium target, a first molybdenum disulfide target, a first tungsten disulfide target, and a first tantalum target as first negative electrode targets and using an inert gas as a first work gas,
applying a first target current to the first titanium target, the first tantalum target, the first molybdenum disulfide target, and the first tungsten disulfide target, and
applying a first negative bias to the matrix, thereby depositing the Ti/Ta/MoS$_2$/WS$_2$ multi layer gradient transition layer on a surface of the titanium transition layer,
wherein the first target current applied to the first titanium target is decreased from 2.1-3.0 A to 0, a first sputtering power applied to the first molybdenum disulfide target and the first tungsten disulfide target is gradually increased from 0 to 0.73-0.97 kW, the first target current applied to the first tantalum target is gradually increased from 0 to 0.1-0.4 A, the first negative bias of the matrix is −30 to −70 V, a flow of the first work gas is 12-16 sccm, a first temperature of the matrix is 80-120° C., a first pressure of a reaction chamber is $1.0$-$3.0\times10^{-1}$ Pa, and a first deposition time is 100-120 s; the inert gas is argon; a thickness of the Ti/Ta/MoS$_2$/WS$_2$ gradient transition layer is 130-170 nm.

7. The preparation method according to claim 6, comprising:
by adopting the magnetron sputtering technology, using a second molybdenum disulfide target, a second tungsten disulfide target, and a second tantalum target as second negative electrode targets and using the inert gas as a second work gas,
applying a second target current to the second tantalum target, the second molybdenum disulfide target, and the second tungsten disulfide target, and
applying a second negative bias to the matrix, thereby depositing the tantalum-doped MoS$_2$/WS$_2$ layer on a surface of the Ti/Ta/MoS$_2$/WS$_2$ gradient transition layer,
wherein a second sputtering power applied to the second molybdenum disulfide target and the second tungsten disulfide target is 0.73-0.97 kW, the second target current applied to the second tantalum target is 0.1-0.4 A, the second negative bias of the matrix is −30 to −70 V, a second flow of the second work gas is 12-16 sccm, a second temperature of the matrix is 80-120° C., a second pressure of the reaction chamber is $1.0$-$3.0\times10^{1}$ Pa, and a second deposition time is 6500-8000 s; the inert gas is argon; a thickness of the tantalum-doped MoS$_2$/WS$_2$ multi-layer layer is 2.0-2.5 μm.

8. The preparation method according to claim 4, further comprising: vacuumizing a reaction chamber to a vacuum degree of less than $3\times10^{-3}$ Pa, and performing a plasma etching treatment on the matrix, wherein the plasma etching treatment comprises applying a bias of −400 to −450 V to the matrix, a temperature of the matrix is 100-150° C., and an etching time is 1200-1800 s; and/or,
a material of the matrix comprises a nickel-based 718 high temperature steel or a monocrystalline silicon wafer.

9. A method of using the tantalum-doped MoS$_2$/WS$_2$ multi-layer film according to claim 1 for surface protection of aerospace components, comprising: applying the multi-layer film to an aerospace component comprising a matrix material, wherein the matrix material comprises a nickel-based 718 high temperature steel or a monocrystalline silicon wafer.

10. A device, comprising a matrix, wherein
the tantalum-doped MoS$_2$/WS$_2$ multi-layer film according to claim 1 is arranged on the matrix;
a material of the matrix comprises a nickel-based 718 high temperature steel or a monocrystalline silicon wafer; and the device comprises an aerospace vehicle.

11. The preparation method according to claim 4, wherein a percent content of tantalum atoms in the tantalum-doped MoS$_2$/WS$_2$ multi-layer film is 0.7-4.4%.

12. The preparation method according to claim 4, wherein
a thickness of the titanium layer is 80-120 nm; and/or
a thickness of the Ti/Ta/MoS$_2$/WS$_2$ gradient transition layer is 130-170 nm; and/or
a thickness of the tantalum-doped MoS$_2$/WS$_2$ layer is 2.0-2.5 μm; and/or
the tantalum-doped MoS$_2$/WS$_2$ multi-layer film has a hardness of more than 6 GPa; and/or
the tantalum-doped MoS$_2$/WS$_2$ multi-layer film has a friction coefficient of 0.073-0.080 and an abrasion rate of $3.3\times10^{-6}$-$6.4\times10^{-6}$ mm³/Nm under an atmospheric environment at room temperature, and the friction coefficient of 0.030-0.042 and the abrasion rate of $3.1\times10^{-6}$-$5.3\times10^{-6}$ mm³/Nm under an environment of 200° C., and the friction coefficient of 0.040-0.060 and the abrasion rate of $3.7\times10^{-6}$-$9.4\times10^{-6}$ mm³/Nm under an environment of 400° C.

13. The use according to claim 9, wherein a percent content of tantalum atoms in the tantalum-doped MoS$_2$/WS$_2$ multi-layer film is 0.7-4.4%.

14. The use according to claim 9, wherein
a thickness of the titanium layer is 80-120 nm; and/or
a thickness of the Ti/Ta/MoS$_2$/WS$_2$ gradient transition layer is 130-170 nm; and/or
a thickness of the tantalum-doped MoS$_2$/WS$_2$ layer is 2.0-2.5 μm; and/or
the tantalum-doped MoS$_2$/WS$_2$ multi-layer film has a hardness of more than 6 GPa; and/or
the tantalum-doped MoS$_2$/WS$_2$ multi-layer film has a friction coefficient of 0.073-0.080 and an abrasion rate of $3.3×10^{-6}$-$6.4×10^{-6}$ mm$^3$/Nm under an atmospheric environment at room temperature, and the friction coefficient of 0.030-0.042 and the abrasion rate of $3.1×10^{-6}$-$5.3×10^{-6}$ mm$^3$/Nm under an environment of 200° C., and the friction coefficient of 0.040-0.060 and the abrasion rate of $3.7×10^{-6}$-$9.4×10^{-6}$ mm$^3$/Nm under an environment of 400° C.

15. The device according to claim 10, wherein a percent content of tantalum atoms in the tantalum-doped MoS$_2$/WS$_2$ multi-layer film is 0.7-4.4%.

16. The device according to claim 10, wherein
a thickness of the titanium layer is 80-120 nm; and/or
a thickness of the Ti/Ta/MoS$_2$/WS$_2$ gradient transition layer is 130-170 nm; and/or
a thickness of the tantalum-doped MoS$_2$/WS$_2$ layer is 2.0-2.5 μm; and/or
the tantalum-doped MoS$_2$/WS$_2$ multi-layer film has a hardness of more than 6 GPa; and/or the tantalum-doped MoS$_2$/WS$_2$ multi-layer film has a friction coefficient of 0.073-0.080 and an abrasion rate of $3.3×10^{-6}$-$6.4×10^{-6}$ mm$^3$/Nm under an atmospheric environment at room temperature, and the friction coefficient of 0.030-0.042 and the abrasion rate of $3.1×10^{-6}$-$5.3×10^{-6}$ mm$^3$/Nm under an environment of 200° C., and the friction coefficient of 0.040-0.060 and the abrasion rate of $3.7×10^{-6}$ mm$^3$/Nm under an environment of 400° C.

\* \* \* \* \*